US007009847B1

(12) United States Patent
Wu et al.

(10) Patent No.: US 7,009,847 B1

(45) Date of Patent: Mar. 7, 2006

(54) CONNECTOR CONCEALMENT MECHANISM FOR COMPUTER PERIPHERAL DEVICE

(75) Inventors: Kuo-Chang Wu, Taipei (TW); Yi-Min Tseng, Taipei (TW); Hsin-Chiang Ho, Taipei (TW); Ya-Chyi Chou, Taipei (TW); Kao-Yu Hsu, Taipei (TW)

(73) Assignee: Inventec Multimedia & Telecom Corporation, Taipei (TW)

( * ) Notice: Subject to any disclaimer, the term of this patent is extended or adjusted under 35 U.S.C. 154(b) by 0 days.

(21) Appl. No.: 11/018,048

(22) Filed: Dec. 20, 2004

(51) Int. Cl.
*H05K 7/16* (2006.01)
*H01R 13/44* (2006.01)

(52) U.S. Cl. ...................... 361/737; 439/131; 439/159; 174/50.52

(58) Field of Classification Search ................ 361/737; 174/50.52, 50.53; 439/131; 235/492
See application file for complete search history.

(56) References Cited

U.S. PATENT DOCUMENTS 5,773,332 A * 6/1998 Glad .......................... 439/344
5,933,328 A * 8/1999 Wallace et al. ............. 361/737
6,059,583 A * 5/2000 Croft et al. ................. 439/131
6,567,273 B1 * 5/2003 Liu et al. ..................... 361/737
D487,458 S * 3/2004 Gentil et al. ............... D14/356
6,786,743 B1 * 9/2004 Huang ........................ 439/131
2003/0124888 A1 * 7/2003 Collins ....................... 439/131
2005/0161513 A1 * 7/2005 Huang et al. ............... 235/492

* cited by examiner

*Primary Examiner*—Kamand Cuneo
*Assistant Examiner*—Dameon E. Levi
(74) *Attorney, Agent, or Firm*—Sawyer Law Group LLP

(57) ABSTRACT

A connector concealment mechanism for computer peripheral device is proposed, which is designed for use in conjunction with a computer peripheral device equipped with an external connector for the connector to be concealable into the casing of the computer peripheral device when not in use, and be easily ejected out of the computer casing for use to connect the computer peripheral device to a computer unit. This feature allows the computer peripheral device to be more advantageous to use than the prior art due to the fact that it allows the user to conceal the connector into the casing of the computer peripheral device when not in use, without having using a separable cap which would easily get lost as in the case of the prior art, thus making the use of the computer peripheral device more convenient and trouble-free than prior art.

11 Claims, 5 Drawing Sheets

CONNECTOR CONCEALMENT MECHANISM FOR COMPUTER PERIPHERAL DEVICE

BACKGROUND OF THE INVENTION

1. Field of the Invention

This invention relates to computer peripheral technology, and more particularly, to a connector concealment mechanism for use with a computer peripheral device equipped with an external connector, such as a USB (Universal Serial Bus) connector or a FireWire connector, for the connector to be concealable into the casing of the computer peripheral device when not in use, and be easily ejected out of the casing for use to connect the computer peripheral device to a computer unit, such as a PC (Personal Computer).

2. Description of Related Art

Most computer platforms are today equipped with a plug-and-play type of external communication interface, such as USB (Universal Serial Bus) or FireWire interface, for the computer platform to be externally connected to various kinds of peripheral devices, such as micro hard drive modules, portable flash memory modules, printers, digital cameras, to name just a few. Since USB and FireWire compliant peripheral devices have a hot plug-and-play capability, they are now widely equipped as a standard option on most PCs.

One drawback to use of the traditional USB or FireWire compliant peripheral devices on the market, however, is that they typically utilize a separable cap for covering the connecting end of the device when not in use, and the cap can be easily get lost when it is removed from the connector, causing troublesome and inconvenience to the user.

SUMMARY OF THE INVENTION

It is therefore an objective of this invention to provide a connector concealment mechanism for use with a computer peripheral device to allow the connector to be concealable into the casing of the computer peripheral device for covered protection of the connector without using a separable cap as in the case of the prior art so as to allow the use of the computer peripheral device to be more convenient and trouble-free.

The connector concealment mechanism according to the invention is designed for use in conjunction with a computer peripheral device equipped with an external connector, such as a USB (Universal Serial Bus) connector or a FireWire connector, for the connector to be concealable into the casing of the computer peripheral device when not in use, and be easily ejected out of the computer casing for use to connect the computer peripheral device to a computer unit, such as a desktop computer, a notebook computer, a tablet computer, a network workstation, and the like.

The connector concealment mechanism according to the invention is more advantageous to use in that it allows the user to conceal the connector into the casing of the computer peripheral device when not in use, without having using a separable cap which would easily get lost as in the case of the prior art. This feature allows the use of the computer peripheral device to be more convenient and trouble-free.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The connector concealment mechanism for computer peripheral device according to the invention is disclosed in full details by way of preferred embodiments in the following with reference to the accompanying drawings.

Figure 1A:
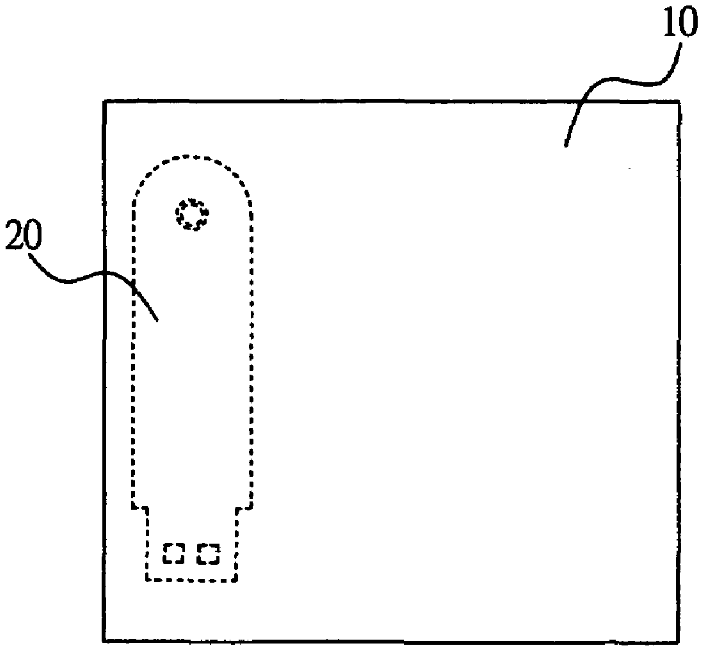
FIG. 1A is a schematic diagram showing a computer peripheral device (micro hard drive module) equipped with a USB connector which is concealed inside the casing of the computer peripheral device.
Figure 1B:
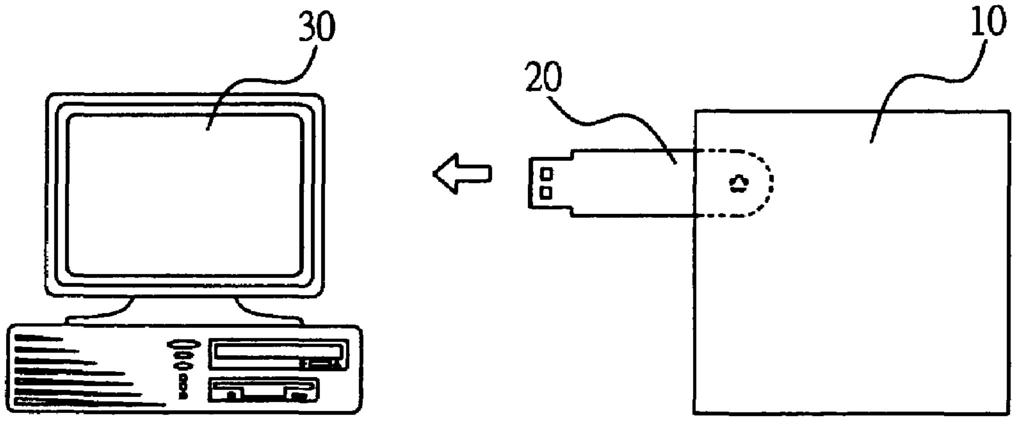
FIG. 1B shows the same computer peripheral device of FIG. 1A except when the concealed connector is here ejected to the outside of the computer peripheral device for connection to a PC.

FIGS. 1A–1B are schematic diagrams showing a computer peripheral device 10 having a connector 20 and equipped with the connector concealment mechanism according to the invention. The computer peripheral device 10 is for example a micro hard drive module or a flash memory module, while the connector 20 is for example a USB (Universal Serial Bus) connector or a FireWire connector, for the purpose of allowing the connector 20 to be concealable into the casing of the computer peripheral device 10 when not in use as illustrated in FIG. 1A, and be easily ejected out of the casing of the computer peripheral device 10 as illustrated in FIG. 1B for use to connect the computer peripheral device 10 to a computer unit 30, such as a desktop computer, a notebook computer, a tablet computer, a network workstation, and the like.

Figure 2:
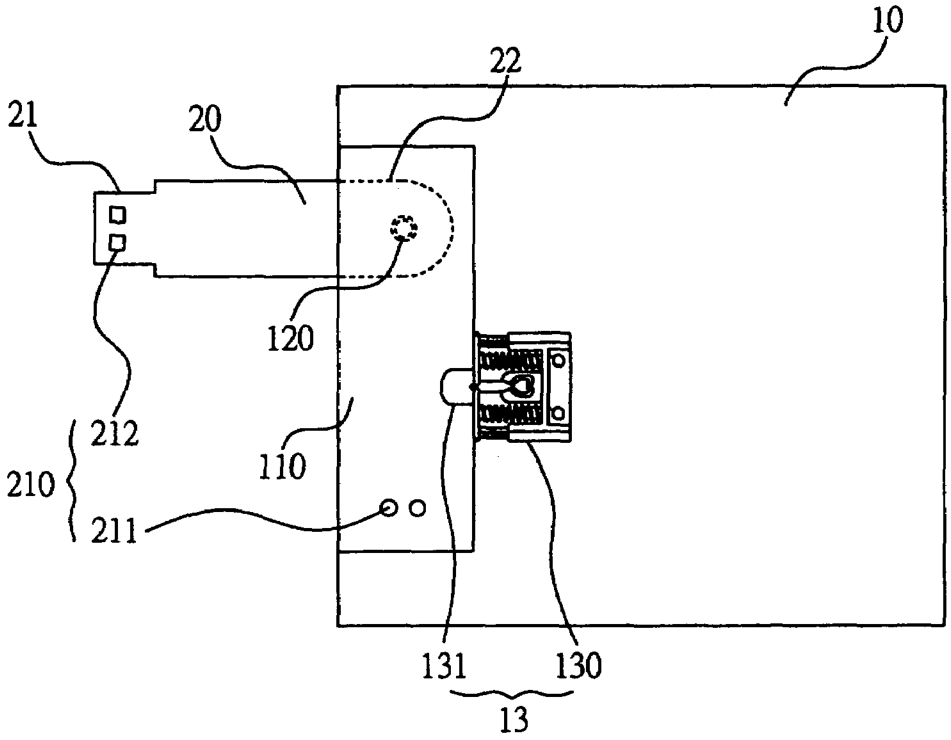
FIG. 2 is a schematic diagram showing a plan view of the connector concealment mechanism according to the invention.

As shown in FIG. 2, the connector concealment mechanism of the invention comprises: (a) a housing structure 110; (b) a pivotal structure 120; and a push-type ejecting device 13; and can further optionally include a locking mechanism 210.

The housing structure 110 is provided inside the casing of the computer peripheral device 10 but with an opening exposed to the outside of the casing, which is dimensioned in compliance with the size of the connector 20 so as to be able to house the connector 20 therein for accommodating the connector 20 inside the casing of the computer peripheral device 10.

The pivotal structure 120 is used to pivotally mounted the non-connecting rear end of the connector 20 within the housing structure 110 for the connector 10 to be pivotally turnable between an internal position inside the housing structure 110 as illustrated in FIG. 1A, and an external position outside the housing structure 110 as illustrated in FIG. 1B.

Figure 4A:
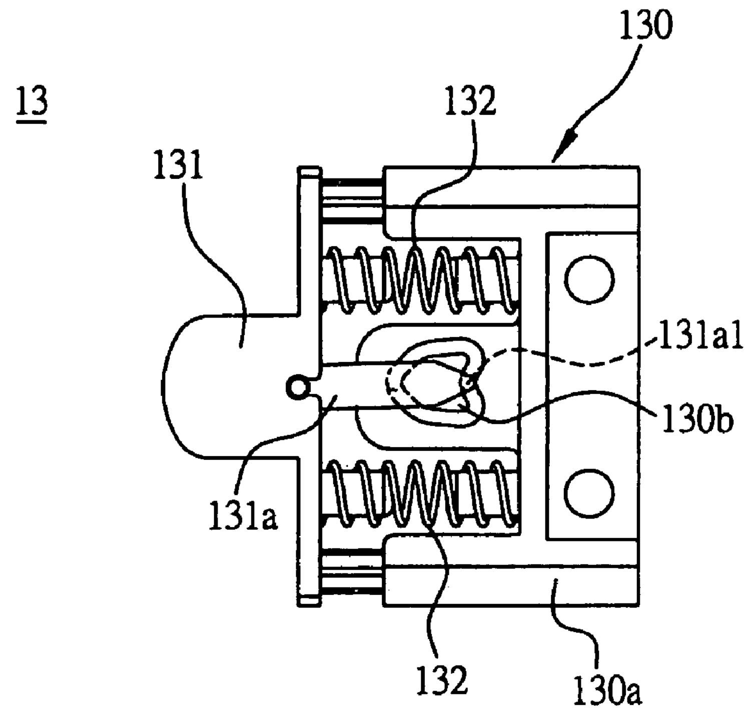
FIG. 4A is a schematic diagram showing the internal structure of the push-type ejecting device utilized by the connector concealment mechanism of the invention when the push button is switched to an inwardly-pressed state.
Figure 4B:
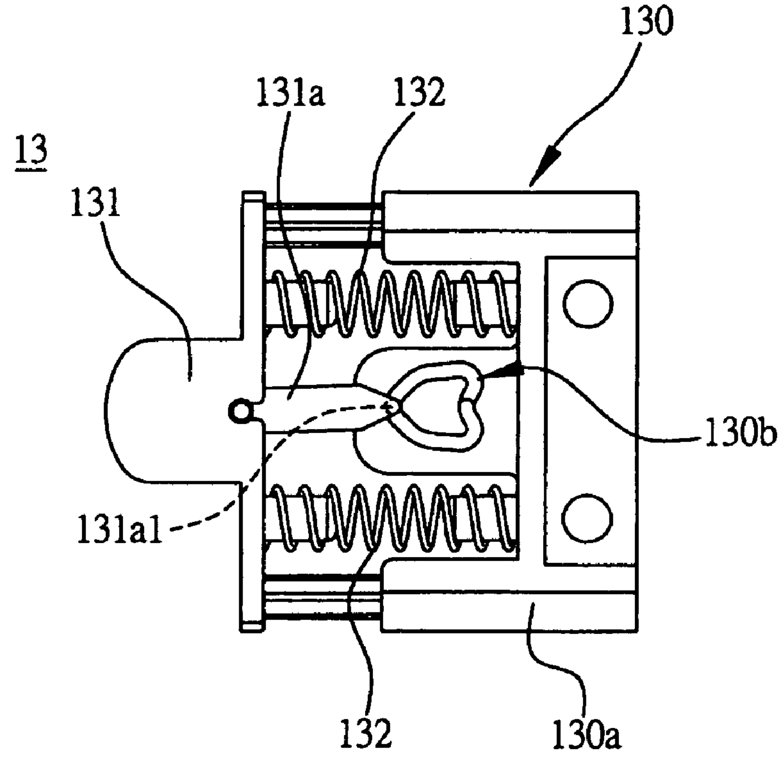
FIG. 4B shows the same of FIG. 4A except when the push button is switched to an outwardly-ejected state.

The push-type ejecting device 13 is mounted within the housing structure 110, and which includes a push button 131 and an ejecting mechanism 130, wherein the push button 131 is functionally linked to the ejecting mechanism to be switchable between an inwardly-pressed state as shown in FIG. 4A and an outwardly-ejected state as shown in FIG. 4B when being pressed by an external force; i.e., when the push button 131 is set in inwardly-pressed state as shown in FIG. 4A and is pressed by an external force, it will cause the ejecting mechanism 130 to eject the push button 131 from inwardly-pressed state shown in FIG. 4A to outwardly-ejected state shown in FIG. 4B; and conversely, when the push button 131 is set in outwardly-ejected state shown in FIG. 4B and is pressed again by an external force, it will cause the push button 131 to be pressed down and then stopped by the ejecting mechanism 130 to be fixed constantly in the inwardly-pressed state shown in FIG. 4A.

Structurally, the aforesaid ejecting mechanism 130 includes a supporting base 130*a* formed with a guide groove 130*b*; while the push button 131 includes a pivotable passive bar 131*a* and a spring 132, where the pivotable passive bar 131*a* has a hooked end 131*a*1 slidably fitted in the guide groove 130*b*, and the spring 132 is mounted between the supporting base 130*a* and the push button 131.

Figure 5A:
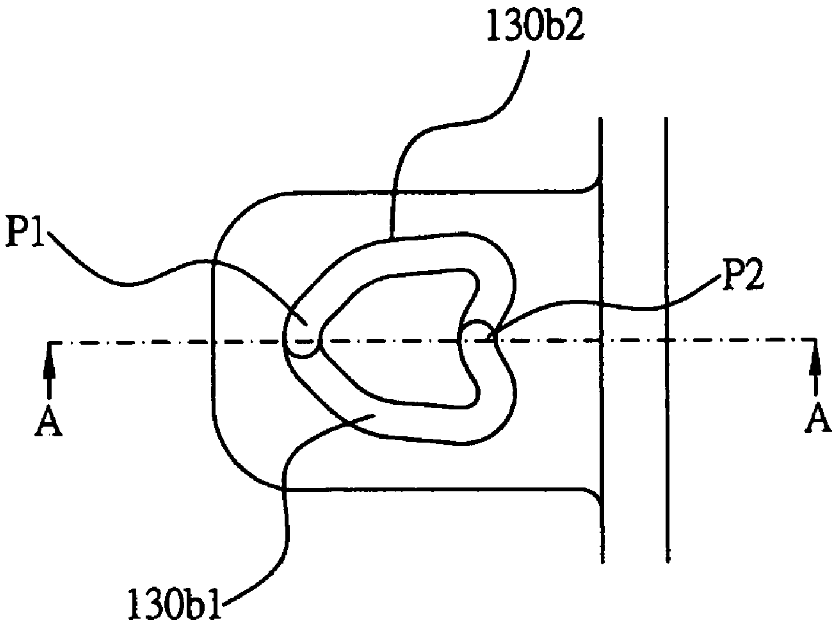
FIG. 5A is a schematic diagram showing a plan view of the guide groove in the push-type ejecting device utilized by the connector concealment mechanism of the invention.
Figure 5B:
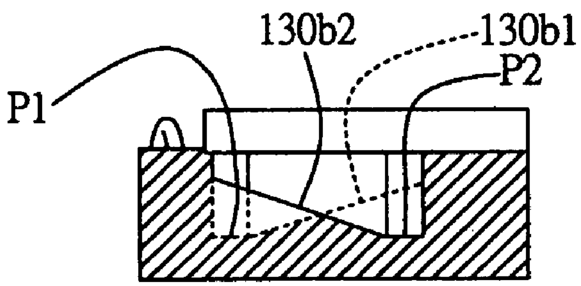
FIG. 5B shows the same of FIG. 5A in sectional view.

Referring to FIGS. 5A–5B, the aforesaid guide groove 130*b* is formed in a heart-like shape having a pair of oppositely connected grooves 130*b*1, 130*b*2 each having a sloped bottom surface having a lower part and a higher part and intercrossed with that of the other. The hooked end 131*a*1 of the pivotable passive bar 131*a* is fitted in the guide groove 130*b* and capable of sliding along the guide groove 130*b*. When the push button 131 is set at unpressed position, the hooked end 131*a*1 of the hooked end 131*a*1 is located at the lower part of the P1 position shown in FIG. 5A, and when the push button 131 is pressed down, the hooked end 131*a*1 will slide along the inward-going groove 130*b*1 toward the higher part of the P2 position and then stop at the lower part of the P2 position. Thereafter, if the push button 131 is pressed again, the hooked end 131*a*1 will slide from the lower part of the P2 position toward the higher part of the P1 position and then stop at the lower part of the P1 position. In conclusion, the hooked end 131*a*1 will be cyclically switched between the P1 position and the P2 position in response to each press of the push button 131.

The locking mechanism 210 is realized, for example, in such a manner as to include a protrusion structure 211 on the inside floor of the housing structure 110 and a corresponding recessed structure 212 on the connector 20, such that when the connector 20 is concealed in position within the housing structure 110, the protrusion structure 211 will fit in to the recessed structure 212, thereby locking the connector 20 in position within the housing structure 110. In practical implementation, for example, if the connector 20 is a USB type, then since USB connectors are typically formed with a number of square holes in the plug 21, these square holes can be directly employed to serve as the aforesaid recessed structure 212 without having to perform extra machining to the USB connector. Alternatively, the locking mechanism 210 has various other modes of realization.

Referring together to FIGS. 1A–1B, FIG. 2, and FIGS. 3A–3B, in actual application, when the computer peripheral device 10 is offered to the user, the connector 20 is concealed within the housing structure 110 in the casing of the computer peripheral device 10. When the user wants to connect the computer peripheral device 10 to the computer unit 30, the user needs just to manually press against the connector 20 to cause the connector 20 to be pushed inwards against the push button 131. Since at this time the push button 131 is in inwardly-pressed state, it will cause the push button 131 to be ejected out by the ejecting mechanism 130, thereby pushing the connector 20 out of the casing of the computer peripheral device 10 as shown in FIG. 1B, allowing the user to utilize the connector 20 to connect the computer peripheral device 10 to the computer unit 30.

Figure 3A:
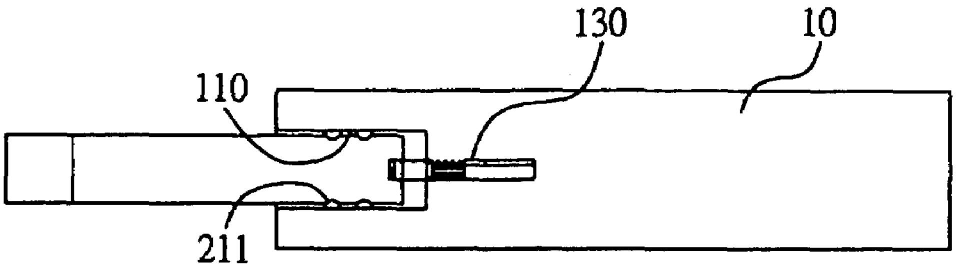
FIG. 3A is a schematic diagram showing a side sectional view of the connector concealment mechanism of the invention when the connector is ejected to the outside of the casing of the computer peripheral device.
Figure 3B:
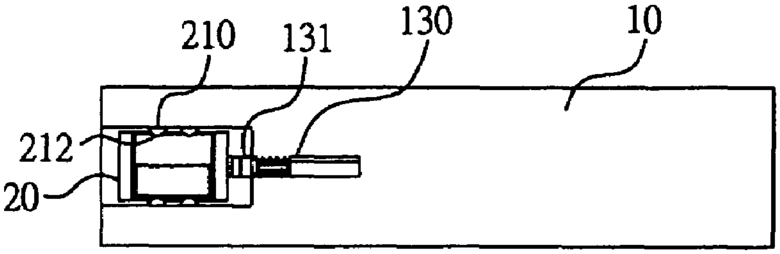
FIG. 3B shows the same of FIG. 3A except when the connector is concealed inside the casing of the computer peripheral device.

When the user no longer wants to use the computer peripheral device 10, the user can then conceal the connector 20 into the connector concealment mechanism of the invention by pivotally turning the connector 20 into the housing structure 110. As the connector 20 is concealed in position within the housing structure 110, the protrusion structure 211 will fit in to the recessed structure 212 as shown in FIG. 3B, thereby locking the connector 20 in position within the housing structure 110 so as to prevent the connector 20 from unforced removal from the housing structure 110. When the connector 20 reaches its intended position within the housing structure 110, its body will come in touch with the push button 131 of the push-type ejecting device 13 so that the push button 131 will be forced back to the inwardly-pressed state. This completes the concealment of the connector 20 into the casing of the computer peripheral device 10. Thereafter, when the user wants to utilize the connector 20, the user can repeat the aforesaid actions to eject the concealed connector 20 from the casing of the computer peripheral device 10.

In conclusion, the invention provides a connector concealment mechanism for computer peripheral device which is designed for use in conjunction with a computer peripheral device equipped with an external connector for the connector to be concealable into the casing of the computer peripheral device when not in use, and be easily ejected out of the computer casing for use to connect the computer peripheral device to a computer unit. This feature allows the invention to be more advantageous to use than the prior art in that it allows the user to conceal the connector into the casing of the computer peripheral device when not in use, without having using a separable cap which would easily get lost as in the case of the prior art, allowing the use of the computer peripheral device to be more convenient and trouble-free. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A connector concealment mechanism for use with a computer peripheral device equipped with an external connector and installed within a casing for the connector to be concealable into the casing of the computer peripheral device when not in use, and ejectable out of the casing for use to connect the computer peripheral device to a computer unit;

the connector concealment mechanism comprising:

a housing structure, which is provided within the casing of the computer peripheral device for accommodating the connector;

a pivotal structure, which pivotally mounts one end of the connector inside the housing structure for the connector to be pivotally turnable between an internal position within the housing structure and an external position outside the housing structure; and a push-type ejecting device, which is mounted inside the housing structure, and which includes a push button and an ejecting mechanism, wherein the push button is functionally linked to the ejecting mechanism to be switchable between an inwardly-pressed state and an outwardly-ejected state when being pressed so that when the connector is concealed inside the housing structure and being pressed by an external force, it causes the connector to press against the push button and thereby cause the push button to be ejected out by the ejecting mechanism, thereby pushing the concealed connector to the outside of the casing.

2. The connector concealment mechanism of claim 1, wherein the computer peripheral device is a micro hard drive module.

3. The connector concealment mechanism of claim 1, wherein the computer peripheral device is a flash memory module.

4. The connector concealment mechanism of claim 1, wherein the connector is a USB (Universal Serial Bus) connector.

5. The connector concealment mechanism of claim 1, wherein the connector is a FireWire connector.

6. The connector concealment mechanism of claim 1, further comprising:

a locking mechanism, which is capable of applying a locking force to the connector when the connector is concealed in position within the housing structure.

7. The connector concealment mechanism of claim 6, wherein the locking mechanism includes a protrusion structure inside the housing structure and a corresponding recessed structure on the connector, such that when the connector is concealed in position within the housing structure, the protrusion structure is fitted in the recessed structure to thereby lock the connector in position within the housing structure.

8. The connector concealment mechanism of claim 1, wherein the ejecting mechanism includes:

a supporting base formed with a guide groove which is shaped in a closed heart-like structure having a pair of oppositely connected grooves each having a sloped bottom surface having a lower part and a higher part and intercrossed with that of the other.

9. The connector concealment mechanism of claim 1, wherein the push button includes:

a pivotable passive bar having a hooked end slidably fitted in the guide groove so that the pressing of the push button will push against the pivotable passive bar, causing the hooked end to pivotally slide along the guide groove.

10. The connector concealment mechanism of claim 8, wherein the push-type ejecting device includes:

a spring mounted between the supporting base and the push button for providing an elastic restoration force when the push button is pressed to cause the hooked end to move along the outward-going part of the guide groove.

11. The connector concealment mechanism of claim 9, wherein the push-type ejecting device includes:

a spring mounted between the supporting base and the push button for providing an elastic restoration force when the push button is pressed to cause the hooked end to move along the outward-going part of the guide groove.

* * * * *